United States Patent

Masujima et al.

[11] Patent Number: 6,136,168
[45] Date of Patent: Oct. 24, 2000

[54] CLEAN TRANSFER METHOD AND APPARATUS THEREFOR

[75] Inventors: Sho Masujima, Tokyo; Eisaku Miyauchi, Akita-ken; Toshihiko Miyajima, Akita-ken; Hideaki Watanabe, Akita-ken, all of Japan

[73] Assignee: TDK Corporation, Japan

[21] Appl. No.: 09/135,614

[22] Filed: Aug. 18, 1998

Related U.S. Application Data

[63] Continuation of application No. 08/647,483, Dec. 28, 1995, abandoned, which is a continuation of application No. 08/176,197, Jan. 3, 1994, abandoned.

[30] Foreign Application Priority Data

Jan. 21, 1993 [JP] Japan .................................. 5-24992
Mar. 15, 1993 [JP] Japan .................................. 5-78642

[51] Int. Cl.⁷ ............................................... C23C 14/56
[52] U.S. Cl. ........................... 204/298.25; 204/298.26; 204/298.35; 156/345; 118/719; 414/217; 414/222.01; 414/222.04; 414/222.13
[58] Field of Search ........................... 251/327; 414/217, 414/222, 222.01, 222.04, 222.13; 204/298.25, 298.26, 298.35; 156/345; 118/719

[56] References Cited

U.S. PATENT DOCUMENTS

| | | | |
|---|---|---|---|
| 4,367,766 | 1/1983 | Uomala ................................. | 137/243 |
| 4,389,037 | 6/1983 | Anders .................................. | 251/327 |
| 4,449,547 | 5/1984 | Krakovasky ........................... | 137/330 |
| 4,663,009 | 5/1987 | Bloomquist et al. ......... | 204/298.25 X |
| 4,776,564 | 10/1988 | Westenberg ........................ | 251/172 |
| 4,851,101 | 7/1989 | Hutchinson ................... | 204/298.25 X |
| 4,990,047 | 2/1991 | Wagner et al. ........................ | 414/217 |
| 5,139,459 | 8/1992 | Takahashi et al. ...................... | 454/187 |
| 5,286,296 | 2/1994 | Sato et al. ...................... | 204/298.25 X |
| 5,288,379 | 2/1994 | Namiki et al. ................. | 204/298.25 X |
| 5,292,393 | 3/1994 | Maydan et al. ................ | 204/298.25 X |
| 5,310,410 | 5/1994 | Begin et al. ................... | 204/298.25 X |
| 5,364,219 | 11/1994 | Takahashi et al. ...................... | 414/217 |

FOREIGN PATENT DOCUMENTS

| | | |
|---|---|---|
| 60-238479 | 11/1985 | Japan . |
| 288765 | 3/1990 | Japan . |
| WO86 00870 | 2/1986 | WIPO . |
| WO87 03979 | 7/1987 | WIPO . |
| WO90 14273 | 11/1990 | WIPO . |

*Primary Examiner*—Rodney McDonald
*Attorney, Agent, or Firm*—Lerner, David, Littenberg, Krumholz & Mentlik, LLP

[57] ABSTRACT

A clean transfer method and an apparatus therefor capable of receiving, storing and transferring a transferred object by means of a vacuum clean box while eliminating arrangement of any vacuum evacuation means and transfer means in the vacuum clean box, as well as facilitating connection of the vacuum clean box to various processing units. The vacuum clean box is free of any vacuum evacuation means and transfer means and is provided with a first opening selectively closed with a first shutter and kept airtight when the first opening is closed with the first shutter. The vacuum clean box is airtightly connected to a sputter unit which is provided with a second opening selectively closed with a second shutter, when the first and second openings are closed with the first and second shutters, respectively, resulting in forming a closed space therebetween through which the first and second shutters are opposite to each other. Then, the first and second openings are released from the first and second shutters to permit the vacuum clean box and sputter unit to communicate with each other.

20 Claims, 12 Drawing Sheets

F I G. 2
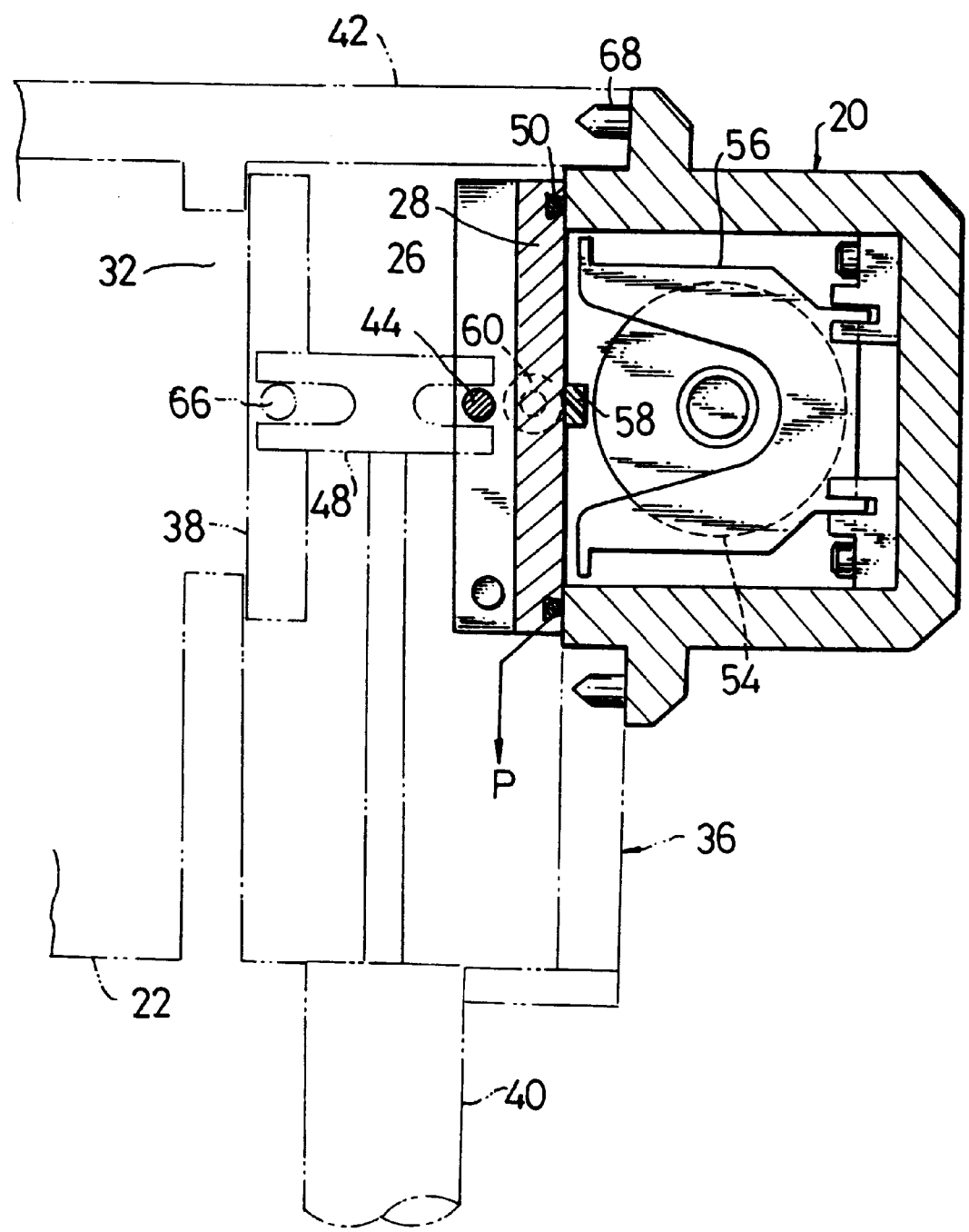

CLEAN TRANSFER METHOD AND APPARATUS THEREFOR

CROSS REFERENCE TO RELATED APPLICATIONS

This application is a continuation of U.S. application Ser. No. 08/647,483, filed Dec. 28, 1995, now abandoned, which in turn is a continuation of U.S. Application Ser. No. 08/176,197, filed Jan. 3, 1994, now abandoned.

BACKGROUND OF THE INVENTION

This invention relates to a clean transfer method and an apparatus therefor, and more particularly to a clean transfer method for transferring an object to be transferred (hereinafter referred to as "transferred object") required for processing and/or assembling a product associated with a semiconductor, an optical disc or the like while keeping an operating environment clean and free of any contamination, and an apparatus therefor.

The assignee proposed a method for transferring a transferred object between various processing units such as a film forming unit and the like by means of a clean transfer carrier which is provided therein with a vacuum clean chamber and a transfer means for transferring the transferred object in the vacuum clean chamber, as disclosed in co-pending U.S. patent application Ser. No. 902,720 now U.S. Pat. No. 5,364,219 filed by the assignee based on Japanese Patent Application No. 177803/1992, of which the disclosure is incorporated herein by reference.

Unfortunately, it was found that the transferring method proposed by the assignee which utilizes the cleans transfer carrier provided with the vacuum cleans chamber for receiving the transferred object therein and the transfer means for transferring the transferred object as described above encounters several disadvantages.

One of the disadvantages is that it is highly troublesome to accurately align the clean transfer carrier with each of the processing units when it is desired to combine the vacuum clean chamber with the unit.

Another disadvantage encountered with the proposed method is that once the combination between the clean transfer carrier and the processing unit is carried out, the clean transfer carrier is kept stationary, resulting in an operating rate of the clean transfer carrier being decreased. In particular, use of an unmanned carrier as the clean transfer carrier fails to permit it to be diverted to different purposes.

A further disadvantage of the proposed method is that incorporation of the transfer means such as a robot in the vacuum clean chamber of the clean transfer carrier causes a size of the vacuum clean chamber to be excessively increased, so that much time is required for evacuation of the vacuum clean chamber carried out after it is combined with each of the processing units and a period of time for which the vacuum cleans chamber is kept at a vacuum after it is released from the processing unit is substantially reduced.

The proposed method has still another disadvantage that a large-sized vacuum unit such as a vacuum stocker or the like is required for storage of the transferred object.

SUMMARY OF THE INVENTION

The present invention has been made in view of the foregoing disadvantages of the prior art.

Accordingly, it is an object of the present invention to provide a clean transfer method which is capable of eliminating a necessity of arranging any vacuum evacuation means and transfer means in a vacuum clean box.

It is another object of the present invention to provide a cleans transfer method which is capable of facilitating connection and disconnection of a vacuum clean box with respect to any processing unit.

It is a further object of the present invention to provide a clean transfer method which is capable of permitting a period of time during which a vacuum is kept in a vacuum clean box to be significantly increased.

It is still another object of the present invention to provide a clean transfer method which is capable of minimizing a size of a space in a vacuum clean box which must be kept at a vacuum.

It is yet another object of the present invention to provide a clean transfer apparatus which is capable of eliminating arrangement of any vacuum evacuation means and transfer means in a vacuum clean box.

It is even another object of the present invention to provide a clean transfer apparatus which is capable of permitting a vacuum clean box to be readily combined with a processing unit.

It is a still further object of the present invention to provide a clean transfer apparatus which is capable of minimizing a size of a space in a vacuum clean box which must be kept at a vacuum.

It is a yet further object of the present invention to provide a clean transfer apparatus which is capable of being readily combined with any processing unit.

It is an even further object of the present invention to provide a clean transfer apparatus which is capable of substantially increasing a period of time during which a vacuum is kept therein.

It is another object of the present invention to provide a clean transfer apparatus which is capable of being easily handled.

In accordance with one aspect of the present invention, a clean transfer method is provided. The method comprises the step of airtightly connecting a vacuum clean box and a vacuum unit to each other. The vacuum clean box is free of any vacuum evacuation means and transfer means. Also, the vacuum clean box is provided with a first opening selectively closed with a first shutter and constructed so as to provide airtightness sufficient to keep an interior thereof at a vacuum when the first opening is closed with the first shutter. The vacuum unit is provided with a second opening selectively closed with a second shutter. The connection between the vacuum clean box and the vacuum unit is carried out while keeping the first and second openings closed with the first and second shutters, respectively, to thereby form a closed space therebetween through which the first and second shutters are opposite to each other. The method also comprises the step of releasing the first and second openings of the vacuum clean box and vacuum box from the first and second shutters, respectively, to thereby permit the vacuum clean box and vacuum unit to communicate with each other.

Also, in accordance with this aspect of the present invention, a clean transfer method is provided. The method comprises the step of airtightly connecting a vacuum clean box and a vacuum unit to each other. The vacuum clean box is free of any vacuum evacuation means and transfer means. Also, the vacuum clean box includes a box body provided with a first opening and a first shutter arranged so as to selectively airtightly close the first opening and serve also as a lid and constructed so as to provide airtightness sufficient to keep an interior thereof at a vacuum when the first opening is closed with the first shutter. The vacuum unit is provided with a second opening and includes a second shutter detachably engaged with the first shutter of the vacuum clean box and arranged so as to selectively close the second opening of the vacuum unit. The connection between the vacuum clean box and the vacuum unit is carried out while keeping the first and second shutters engaged with each other when the first and second openings are kept closed with the first and second shutters, to thereby form a closed space therebetween through which the first and second shutters are opposite to each other. Also, the method comprises the steps of evacuating the closed space to a vacuum and introducing the first and second shutters into the vacuum unit while keeping the first and second shutters integral with each other.

In accordance with another aspect of the present invention, a clean transfer apparatus is provided. The apparatus includes a vacuum clean box free of any vacuum evacuation means and transfer means. The vacuum clean box is provided with a first opening selectively closed with a first shutter and constructed so as to provide airtightness sufficient to keep an interior thereof at a vacuum when the first opening is closed with the first shutter. The apparatus also includes a vacuum unit provided with a second opening selectively closed with a second shutter and a shutter actuation means for actuating both first and second shutters of the vacuum clean box and vacuum unit. The shutter actuation means is arranged on the side of the vacuum unit. The vacuum clean box and vacuum unit cooperate with each other to form a closed space therebetween through which the first and second shutters are opposite to each other when the vacuum clean box and vacuum unit are connected to each other, so that the vacuum clean box and vacuum unit are permitted to communicate with each other through the closed space when the first and second openings are released from the first and second shutters, respectively.

Further, in accordance with this aspect of the present invention, a clean transfer apparatus is provided. The apparatus includes a vacuum clean box free of any vacuum evacuation means and transfer means. The vacuum clean box includes a box body provided with a first opening and a first shutter arranged so as to selectively close the first opening and serve also as a lid and constructed so as to provide airtightness sufficient to keep an interior thereof at a vacuum when the first opening is closed with the first shutter. The apparatus also includes a vacuum unit provided with a second opening and including a second shutter detachably engaged with the first shutter of the vacuum clean box and arranged so as to selectively close the second opening of the vacuum unit and a shutter actuation means for actuating the second shutter. The vacuum clean box and vacuum unit, when connected to each other, cooperate with each other to form a closed space therebetween through which the first and second shutters are opposite to each other. The vacuum clean box and vacuum unit communicate with each other when the first and second shutters are introduced into the vacuum unit by the shutter actuation means while being kept engaged with each other.

The present invention constructed as described above eliminates arrangement of any vacuum evacuation means and transfer means in the vacuum clean box, to thereby be simplified in construction. More particularly, positioning of the vacuum clean box with respect to each of the vacuum units or processing units kept at a vacuum is highly facilitated. Also, connection of the vacuum clean box to the processing unit may be readily carried out manually or by means of a commercially available robot which is not required to be kept clean. Further, even when an unmanned carrier is used for moving the vacuum clean box, the unmanned carrier may be moved to any desired place after connection of the vacuum clean box to the processing unit, so that the unmanned carrier may be significantly increased in operating efficiency. In addition, a size of a space in the vacuum clean box is minimized because it is free of any vacuum evacuation means and transfer means, to thereby be adequately kept airtight to a degree of substantially increasing a period of time during which a vacuum is kept therein. In addition, the transferred object can be stored for an increased period of time while being received in the vacuum clean box, resulting in handling of the transferred object being facilitated.

In addition, the shutter of the vacuum clean box is drawn into the vacuum unit by means of the shutter actuation means while being kept engaged with the shutter on the side of the vacuum unit. Such construction permits the transferred objects to be readily transferred between the vacuum clean box and the vacuum unit. Moreover, the transferred objects and the shutter may be concurrently introduced into the vacuum unit, so that a size of the closed space required to be evacuated between the vacuum clean box and the vacuum unit may be minimized, resulting in substantially reducing time required for connection and disconnection of the vacuum clean box with respect to the vacuum unit. Furthermore, a space in the vacuum clean box is minimized because it is free of any vacuum evacuation means and transfer means, to thereby be more adequately kept airtight to a degree of more increasing a period of time during which a vacuum is kept in the vacuum clean box.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein:

FIG. 2 is a plan view partly in section showing a vacuum clean box incorporated in a modification of the clean transfer apparatus shown in FIG. 1;

DETAILED DESCRIPTION OF THE PREFERRED EMBODIMENTS

Now, a clean transfer method and an apparatus therefor according to the present invention will be described hereinafter with reference to the accompanying drawings.

Figure 1:
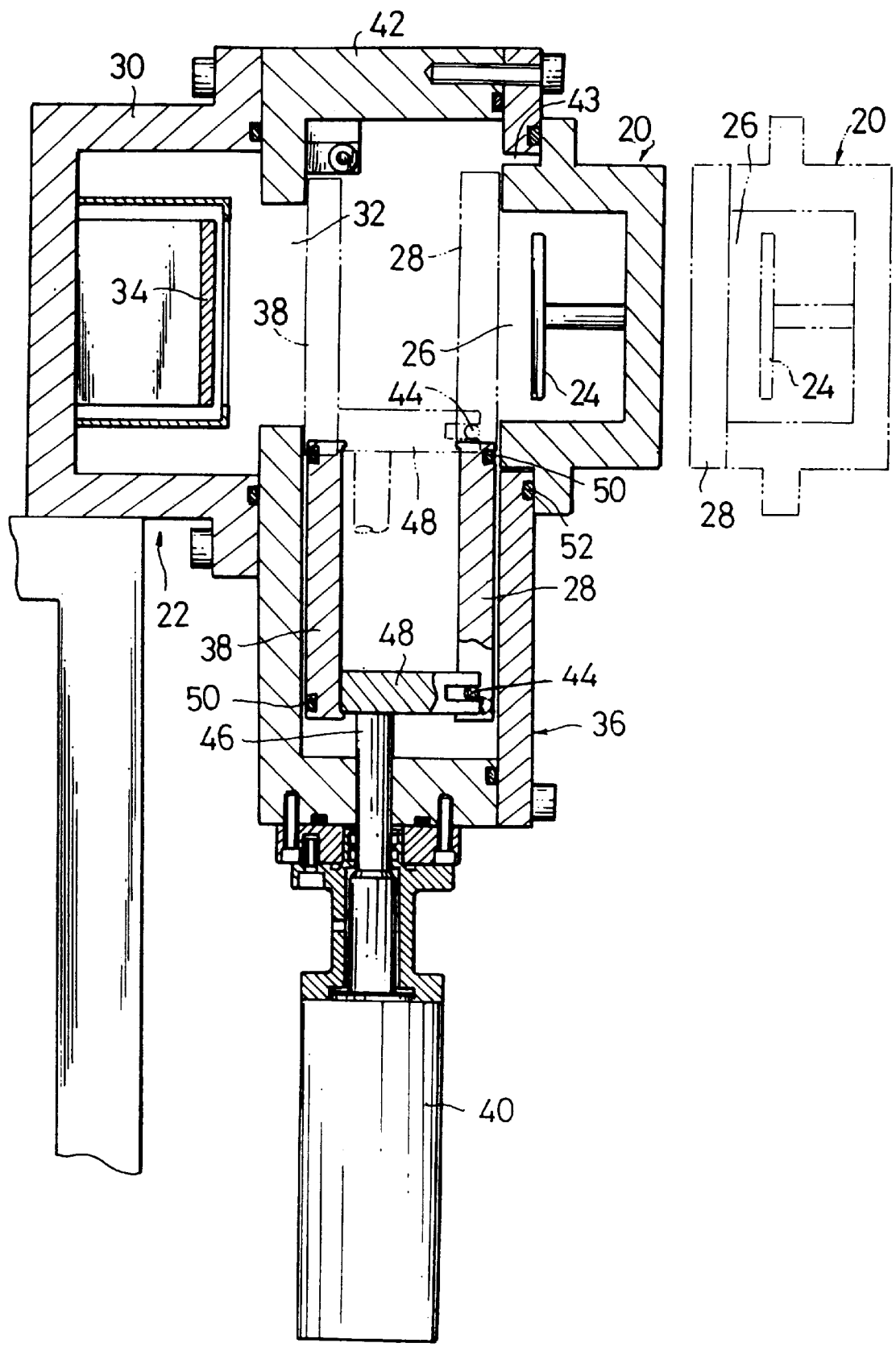
FIG. 1 is a front elevation view in section showing an embodiment of a clean transfer apparatus according to the present invention.

Referring first to FIG. 1, a first embodiment of a clean transfer apparatus according to the present invention is illustrated. A clean transfer apparatus of the illustrated embodiment generally includes a vacuum clean box 20 and a sputter unit 22 acting as a vacuum unit. The vacuum clean box 20 has a transferred object or substrate 24 stationarily supported therein. The illustrated embodiment is adapted to form a film on the substrate 24. The vacuum clean box 20 is provided with a transfer port or first opening 26 which is opened or selectively closed with a first shutter 28 and through which the transferred object 24 is introduced into the vacuum clean box 20.

The sputter unit 22 acting as a vacuum unit or processing unit includes an airtight vessel 30, which is formed with a second opening 32 and provided therein with a target 34 constructed so as to emit sputter particles therefrom. The sputter unit 22 is operatively connected thereto a double gate valve mechanism 36, which includes a second shutter 38 for opening or selectively closing the second opening 32 of the sputter unit 22, the above-described shutter 28, and a fluid pressure cylinder 40 for actuating the shutters 28 and 38. The double gate valve mechanism 36 also includes an airtight vessel 42 airtightly connected to the airtight vessel 30 of the sputter unit 22. The airtight vessel 42 is formed with an opening 43 so as to be opposite to the transfer port 26 of the vacuum clean box 20. The shutter 28 arranged on the side of the vacuum clean box 20 is provided with an engagement pin or projection 44. The fluid pressure cylinder 40 includes a piston rod 46, which is provided at a distal end thereof with an engagement member 48, which is formed with a groove or recess adapted to be fittedly engaged with the engagement pin 44 of the first shutter 28. The shutter 38 arranged on the side of the sputter unit 22 is mounted on the engagement member 48, resulting in being vertically moved with vertical movement of the engagement member 48 and therefore the piston rod 46 of the cylinder 40.

When the vacuum clean box 20 is separated or disconnected from the sputter unit 22, the shutter 28 is disengaged from the double gate valve mechanism 36 while closing the transfer port 26 of the vacuum clean box 20. More particularly, the engagement pin 44 of the shutter 28 and the engagement member 48 are engaged with each other when the vacuum clean box 20 is connected to the opening 43 of the airtight vessel 42 and disengaged from each other when the vacuum clean box 20 is separated from the opening 43. The shutters 28 and 38 each are provided at a portion thereof abutted against a periphery of each of the openings 26 and 32 with airtight seal elements 50. Likewise, the airtight vessel 42 is provided with airtight seal elements 52 at a periphery of the opening 43 thereof against which the vacuum clean box 20 is abutted.

Now, the manner of operation of the clean transfer apparatus of the illustrated embodiment constructed as described above will be described hereinafter.

The vacuum clean box 20 is previously evacuated to a vacuum by means of a separate vacuum changer (not shown) and then closed with the shutter 28. The evacuation is preferably carried out to a degree of vacuum as low as 0.1 Torr or less to substantially reduce dust. Then, the vacuum clean box 20 is transferred to a position indicated at phantom lines in FIG. 1. When the vacuum clean box 20 and sputter unit 22 are thus kept separated from each other, a pressure difference between a high vacuum in the vacuum clean box 20 and an atmospheric pressure on an outside thereof causes the shutter 28 to be forcedly pressed against the periphery of the transfer port 26 of the vacuum clean box 20, resulting in the shutter 28 being fixedly secured to the vacuum clean box to airtightly close the transfer port or opening 26 of the box 20. Likewise, the shutter 38 located at a position indicated at phantom lines in FIG. 1 is forcedly pressed against the periphery of the opening 32 of the airtight vessel 30 of the sputter unit 22 to airtightly close the opening 32. When the shutter 38 is at the position, the piston rod 46 of the fluid pressure cylinder 40 is kept expanded and the engagement member 48 is kept located at a position indicated at phantom lines.

Then, the vacuum clean box 20 thus kept closed is airtightly connected to the opening 43 of the airtight vessel 42 of the double gate valve mechanism 36, so that the engagement pin 44 of the shutter 28 is fittedly engaged with the recess of the engagement member 48 located at a position indicated at phantom lines. Subsequently, the airtight vessel 42 of the double gate valve mechanism 36 is evacuated to a degree of vacuum as low as, for example, 0.1 Torr or less by means of an evacuation means (not shown) which may be attached to the sputter unit 22. Then, the fluid pressure cylinder 40 is retracted to downwardly move each of the shutters 28 and 38 to a position indicated at solid lines in FIG. 1, to thereby open the openings 26 and 32. This results in a space in the sputter unit 22 and a space in the vacuum clean box 20 communicating with each other, to thereby permit the substrate 24 in the vacuum clean box 20 to be opposite to the target 34 in the sputter unit 22. Thus, emission of desired sputter particles from the target 34 leads to formation of a sputter film on the substrate 24. After completion of the film formation, the double gate valve mechanism 36 is actuated to close the transfer port 26 of the vacuum clean box 20 with the shutter 28 and close the opening 32 of the sputter unit 22 with the shutter 38, so that the vacuum clean box 20 may be released from the sputter unit 22 as indicated at the phantom lines.

As can be seen from the foregoing, the illustrated embodiment does not require or is free of any mechanism for transferring the substrate 24 in a vacuum, to thereby eliminate scattering of dust. Also, the embodiment is simplified in structure, readily utilized for research and development and decreased in manufacturing costs.

Further, the illustrated embodiment may be so constructed that the single vacuum clean box 20 is arranged common to a plurality of the sputter units so as to be connected to the sputter units in turn. Such construction permits a plurality of sputter films to be laminatedly deposited on the substrate 24. In this instance, an order in which the vacuum clean box 20 is connected to the sputter units may be varied as desired. Alternatively, the vacuum clean box may be moved among the sputter units while skipping a part of the sputter units. Also, an order in which the sputter films are laminatedly deposited on the substrate and the number of films to be deposited on the substrate may be varied as desired. Thus, it will be noted that the illustrated embodiment exhibits a significant advantage as compared with an in-line sputter apparatus in which a plurality of sputter units are connected in series to each other to successively transfer a substrate therethrough, because the in-line sputter apparatus causes an order of film formation to be previously determined.

Referring now to FIGS. 2 to 5, a modification of the first embodiment described above is illustrated. A clean transfer apparatus of the modification includes a vacuum clean box 20 which is so constructed that a plurality of optical mini-discs 54 are received therein in a manner to be laterally spaced from each other at predetermined intervals while being vertically kept therein. For this purpose, the vacuum clean box 20, as shown in FIG. 2, includes a plurality of partitions 56 fixedly mounted on an inner surface thereof to define a plurality of compartments therein in which the optical mini-discs 54 are stored, respectively. A transfer port or opening 26 of the vacuum clean box 20 is selectively closed with a shutter 28, which is provided on an inner surface thereof facing the vacuum clean box 20 with a bar stopper 58 of a resin material acting to prevent movement of the optical mini-discs 54 in the vacuum clean box 20 when the box is closed with the shutter 28. Also, the shutter 28 is provided with an engagement pin 44 and pivotally mounted on each of upper and lower ends thereof with a roller 60 for ensuring smooth actuation of the shutter 28. In addition, the shutter 28 is provided at a portion thereof abutted against a periphery of the transfer port 26 with an airtight seal element 50.

Figure 4:
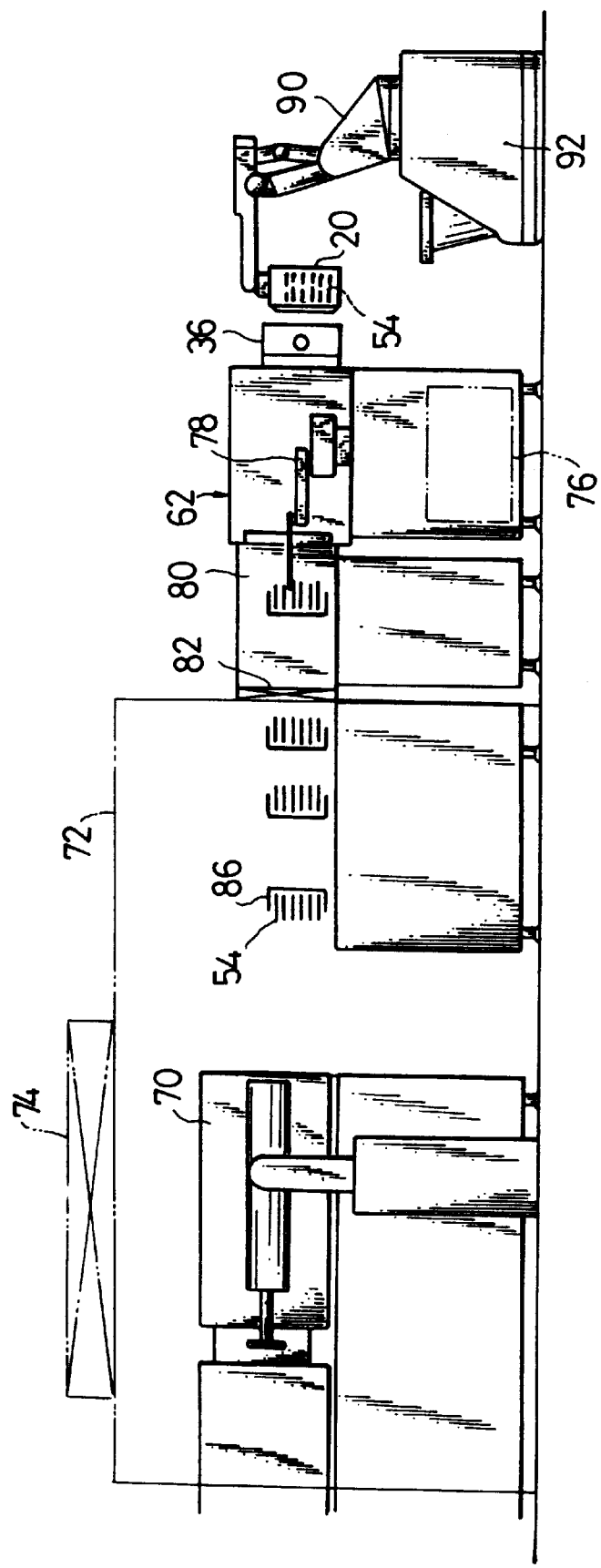
FIG. 4 is a schematic view showing injection molding of an optical mini-disc in the modification shown in FIG. 2.
Figure 5:
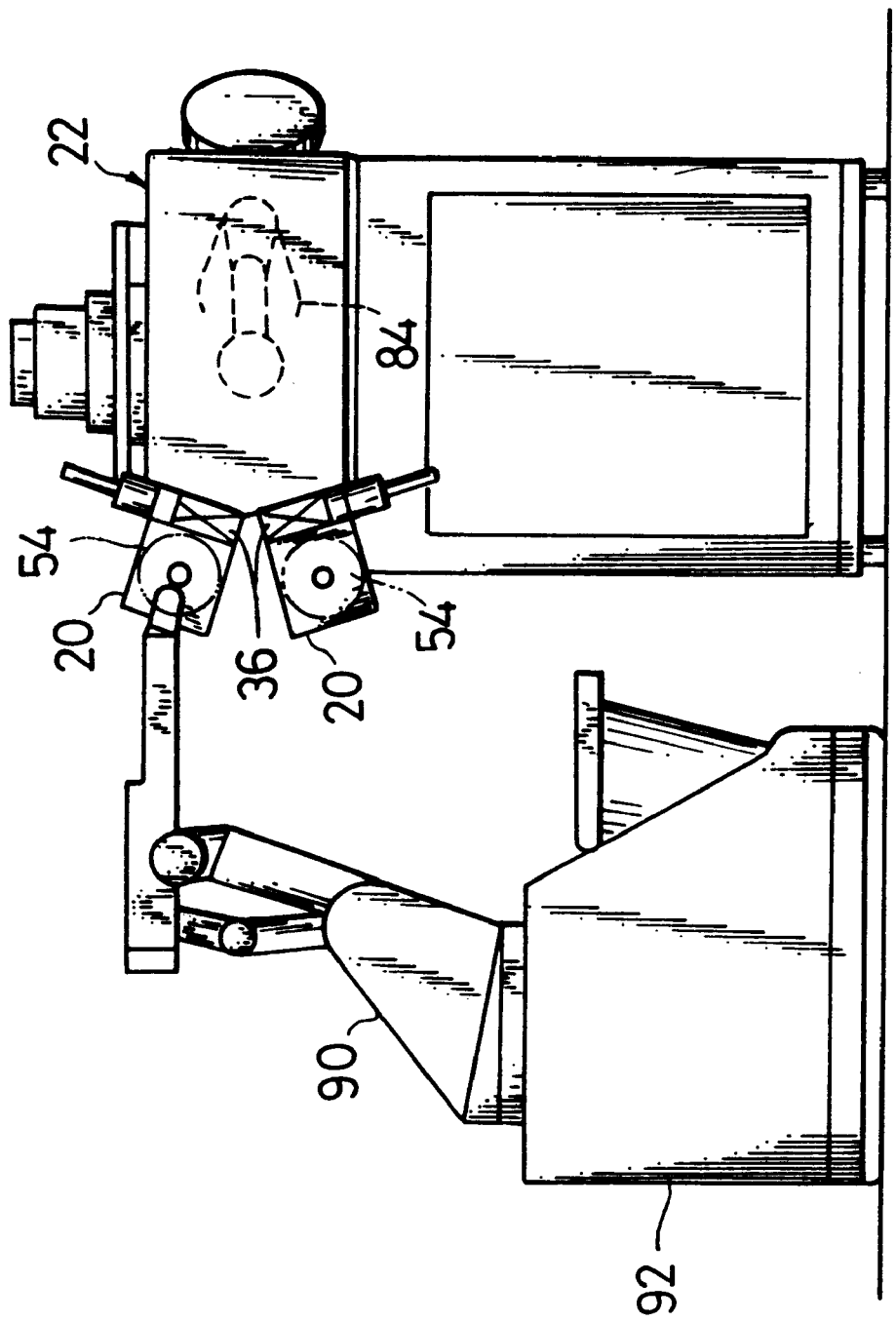
FIG. 5 is a schematic view showing film formation on an optical mini-disc in the modification shown in FIG. 2.

The modification further includes a vacuum changer and a film forming unit are generally indicated at reference numerals 62 and 22 in FIGS. 4 and 5, respectively, each of which includes a double gate valve mechanism 36 constructed in substantially the same manner as that in the above-described embodiment. Thus, the double gate valve mechanism 36, as shown in FIG. 2, includes an airtight vessel 42 which, in the modification, is formed integral with a vacuum unit or processing unit such as the film forming unit 22 or the like, a fluid pressure cylinder 40 and an engagement member 48 fixed at a distal end of the fluid pressure cylinder 40. The engagement member 48 is formed with recesses which are adapted to be fittedly engaged with the engagement pin 44 of the vacuum clean box 20 and an engagement pin 66 of a shutter 38 for selectively closing an opening 32 of the processing unit 22, respectively, to concurrently operate the shutters 28 and 38, when the vacuum clean box 20 is connected to the double gate valve mechanism 36. The vacuum clean box 20 is fixedly mounted with positioning pins 68 and correspondingly the double gate valve mechanism is formed with positioning holes in which the positioning pins 68 are engagedly fitted. Also, the shutter 28 is adapted to be moved or slid while being kept spaced from the transfer port 26 of the vacuum clean box 20 by means of a suitable mechanism (not shown) as indicated at an arrow P in FIG. 2, resulting in the bar stopper 58 for holding the optical mini-discs 54 being prevented from interfering with operation of the shutter 28.

FIG. 4 shows injection molding of the optical mini-disc 54 (a base disc prior to film formation) which is carried out in an air atmosphere. An injection molding machine 70 is arranged in a clean room 72 mounted thereon with a filter 74. The vacuum changer 62 is arranged adjacent to the injection molding machine 70 and provided with a vacuum evacuation means 76 such as a vacuum pump or the like and a transfer means 78 comprising a robot arm. The vacuum changer 62 has a vacuum chamber 80 defined therein which is evacuated to a vacuum. Between the vacuum changer 62 and the clean room 72 is disposed a shutter 82. The double gate valve mechanism 36 is arranged on a side of the vacuum changer 62 for taking out the molded optical mini-discs 54.

FIG. 5 shows formation of a film on the optical mini-disc or base disc 54, wherein the film forming unit 22 such as an sputter unit or the like is provided therein with a film formation means and a transfer means 84 comprising a robot arm. Also, a plurality of the double gate valve mechanism 36 are arranged for connecting the vacuum clean boxes 20 to the film forming unit 64.

Figure 3:
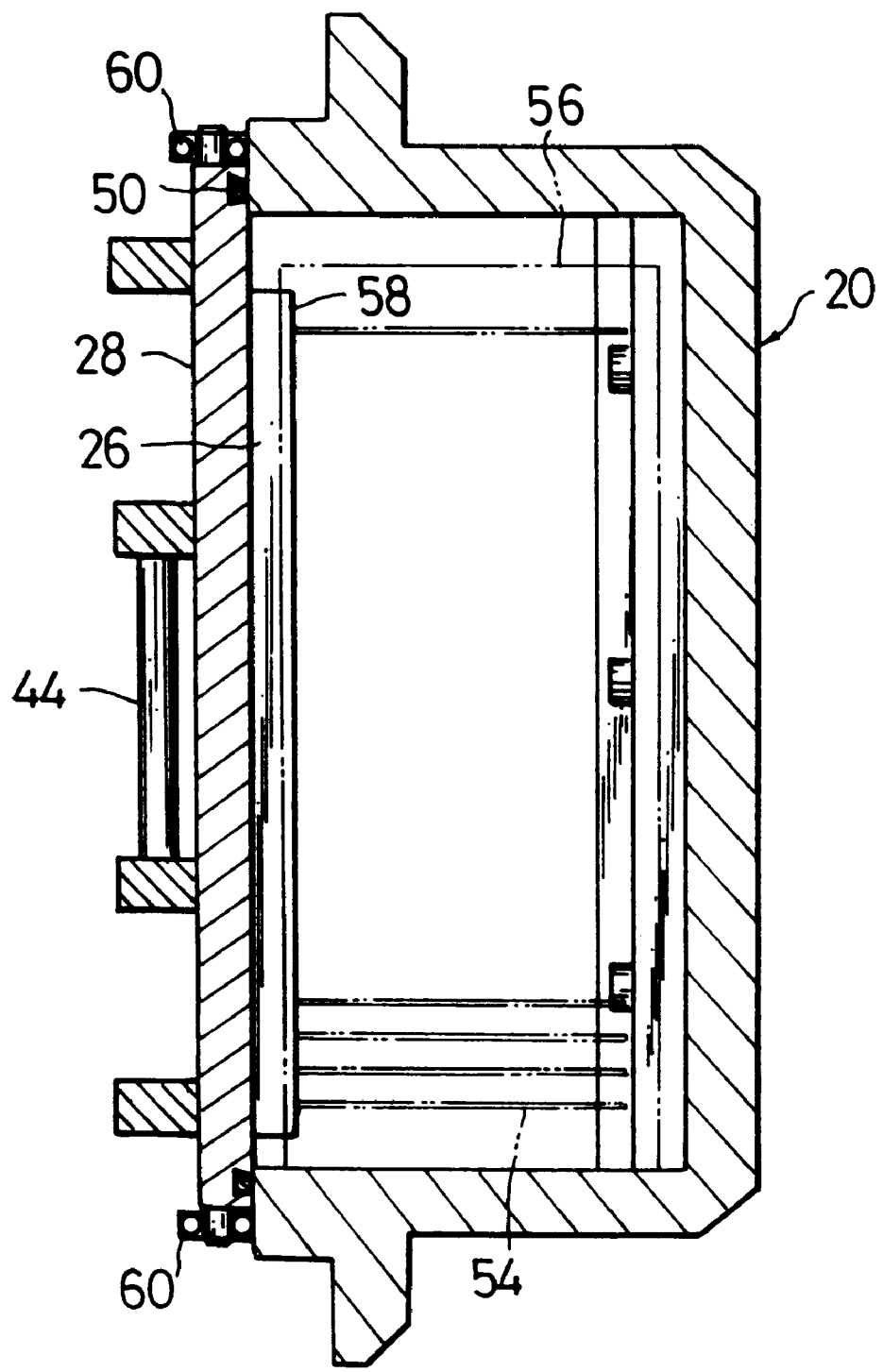
FIG. 3 is a front elevation view in section of the vacuum clean box shown in FIG. 2.

In the modification constructed as described above, a number of optical mini-discs 54 each in the form of a base disc formed by injection molding carried out in the injection molding machine 70 arranged in the clean room 72 of an air atmosphere are received in an open storage box 86 as shown in FIG. 4, which is then transported into the vacuum chamber 80 by means of the robot arm 78 when the vacuum chamber 8U is released from the shutter 82. Then, the vacuum chamber 80 is closed with the shutter 82 and double gate valve mechanism 36 and then evacuated to a vacuum. Subsequently, the vacuum clean box 20 constructed as shown in FIGS. 2 and 3 which is rendered empty is connected to the double gate valve mechanism 36. The connection, as shown in FIG. 4, may be carried out by means of a robot 90 mounted on an unmanned carrier 92. More particularly, the robot 90 is moved to s position opposite to the double gate valve mechanism 36 while holding the vacuum clean box 20 thereon. Then, the robot 90 catches an accurate position through a position identifying means such as a camera, a laser means or the like mounted thereon, to thereby airtightly connect the vacuum clean box 20 to the double gate valve mechanism 36 while aligning both with each other by means of the positioning pins 68 and recesses. Then, after the double gate valve mechanism 36 is evacuated to a vacuum to permit a degree of vacuum in the double gate valve mechanism through which the vacuum clean box 20 and the vacuum changer 62 are connected to each other to be 0.1 Torr or less, the double gate valve mechanism 20 is actuated to open both a shutter on the vacuum changer 62 and the shutter 28 on the vacuum clean box 20. Then, the optical mini-discs 54 (base discs) are transferred to the vacuum clean box 20 by means of the robot arm 78.

The unmanned carrier 92 is moved so as to face the film forming unit 22 shown in FIG. 5 and the vacuum clean box 20 is aligned with the double gate valve mechanism 36 on the side of the film forming unit 22 by means of the robot 90, followed by connection to the mechanism 36. Then, the double gate valve mechanism 36 is evacuated to a degree of vacuum as low as 0.1 Torr or less and then opened to permit the optical mini-discs 54 to be transferred to a predetermined film formation position in the film forming unit 22 one by one by means of the robot arm 84. In FIG. 5, for example, the vacuum clean box 20 on the upper side is adapted to receive therein the optical mini-discs 54 which are not subjected to film formation, whereas that on the lower side is adapted to receive therein the optical mini-discs 54 which have been subjected to film formation. Therefore, the vacuum clean box 20 on the lower side is kept empty. Thus, the optical mini-discs 54 which have been transferred to the film formation position from the upper vacuum clean box 20 by means of the robot arm 84 are subjected to the film formation treatment, followed by transfer to the lower clean box 20 by means of the robot arm 84.

Thus, it will be noted that the modification carries out clean transfer of the transferred objects throughout from the injection molding to the film formation.

Figure 6:
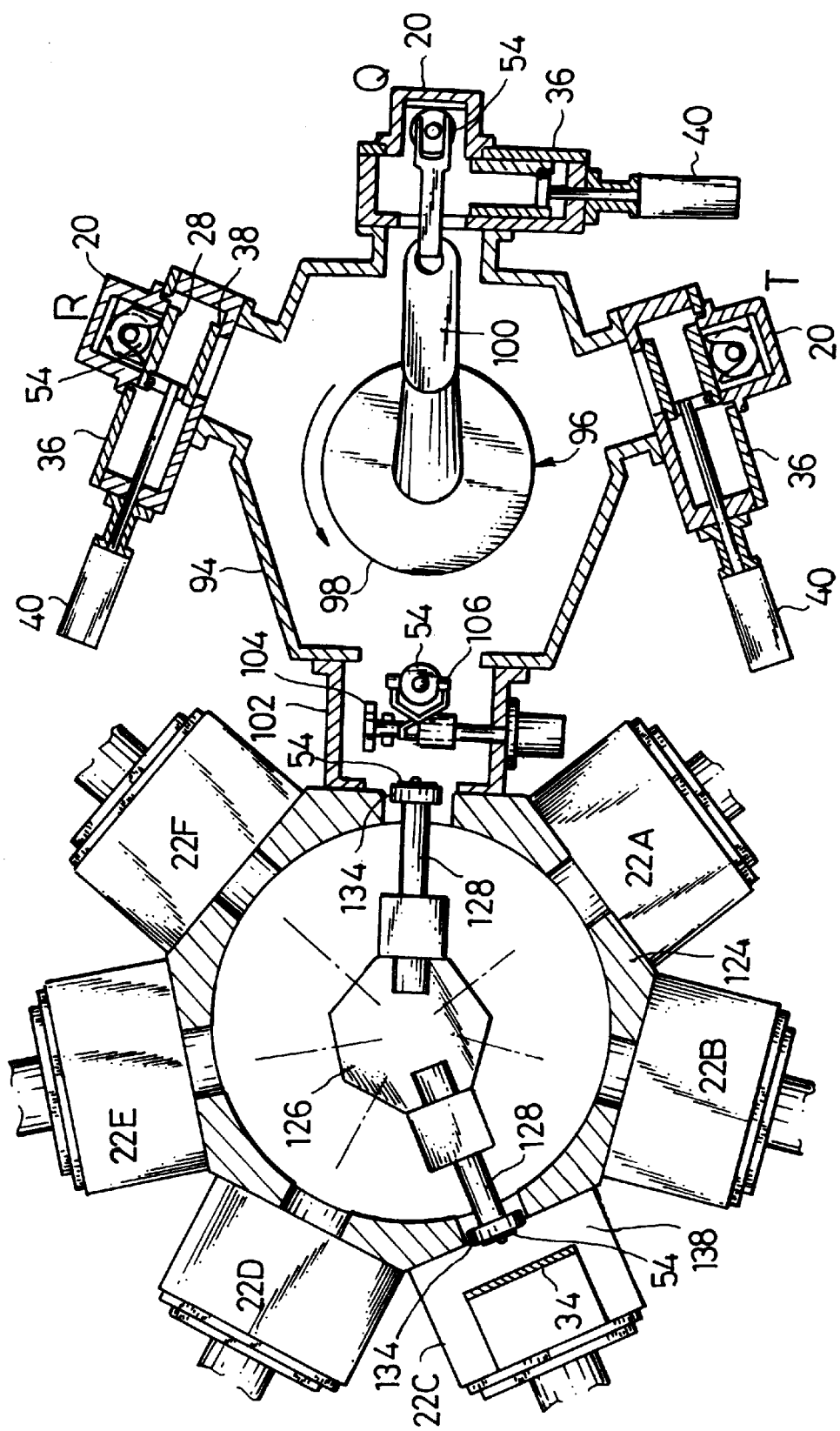
FIG. 6 is a plan view in section showing another modification of the clean transfer apparatus shown in FIG. 1.

Now referring to FIGS. 6 to 9, a second modification of the embodiment shown in FIG. 1 is illustrated. FIG. 6 shows sputter units for optical mini-discs 54, wherein a vacuum clean box 20 constructed in substantially the manner as shown in FIGS. 2 and 3 is used for carrying out each of feeding of the optical mini-discs 54 before film formation and removal of the mini-discs 54 after the film formation. The clean transfer apparatus of the modification includes a first vessel section 94 provided therein with a vacuum robot 96 and mounted thereon with a plurality of double gate valve mechanisms 36. Each of the double gate valve mechanisms 36 is adapted to be connected thereto a vacuum clean box 20. The vacuum robot 96 includes a revolving and lifting drive section 98 and an expandable arm 100 mounted on the drive section 98. An interior of the first vessel section 94 constitutes a stocker chamber through which feeding and removal of the optical mini-discs 54 are carried out.

Figure 7:
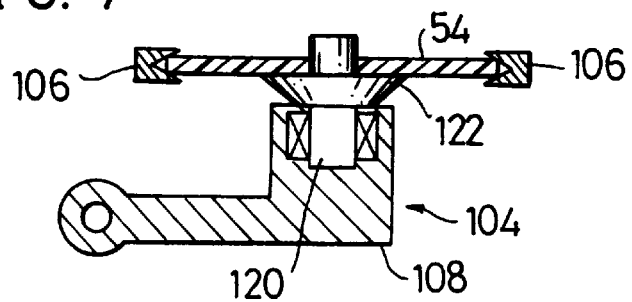
FIG. 7 is a schematic view showing a posture converting unit incorporated in the modification of FIG. 6 and kept horizontal.
Figure 8:
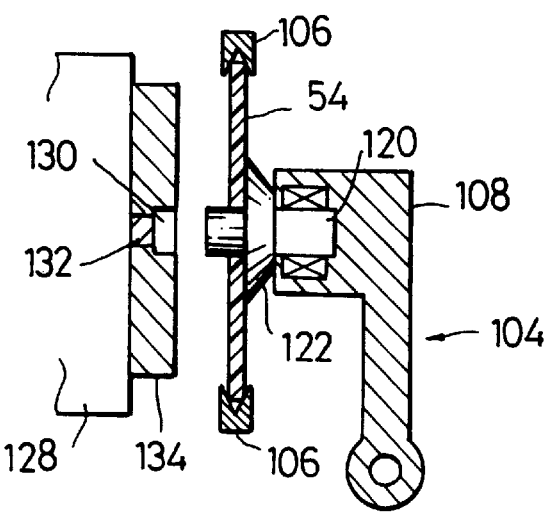
FIG. 8 is a schematic view showing a posture converting unit incorporated in the modification of FIG. 6 and kept vertical.
Figure 9:
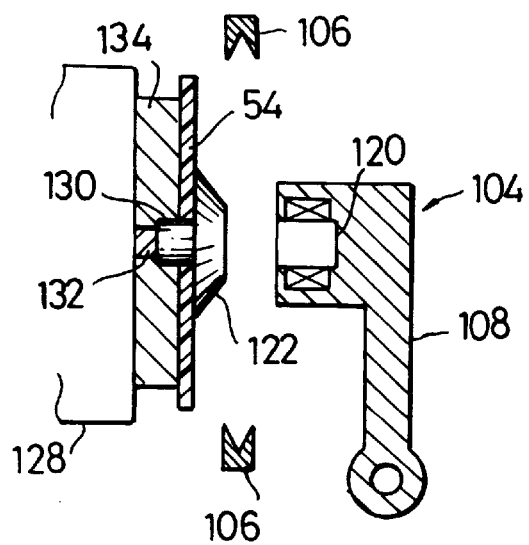
FIG. 9 is a schematic view showing movement of an optical mini-disc from a posture converting unit to a disc holding section.

The clean transfer apparatus also includes a second vessel section 102 airtightly connected to the first vessel section 94. In the second vessel section 100, a posture converting unit 104 for converting a posture of the optical mini-discs from a horizontal state into a vertical state. The posture converting unit 104, as shown in FIGS. 7 to 9, includes a pair of holding members 106 adapted to interposedly hold each of the optical mini-discs 54 therebetween and a pivotal arm 108 provided at a distal end thereof with an electromagnet 120 for magnetically attracting an inner peripheral mask 122 previously mounted on each of the optical mini-discs 54.

The clean transfer apparatus of the second modification, as shown in FIG. 6, further includes a third vessel section 124 airtightly connected to the second vessel section 102, which section 124 is provided therein with an index table 126 which is constructed so as to be intermittently rotated by every angle of 360/7 degrees and mounted thereon with seven expansion arms 128 at angular intervals of 360/7 degrees, which are expandably driven by means of a fluid pressure or the like. The expansion arms 128, as shown in FIGS. 8 and 9, each are formed at a distal end thereof with a recess 130 adapted to be fittedly engaged with a projection of the inner peripheral mask 122 of the optical mini-disc 54. The recess 130 is fixedly mounted on a bottom thereof with a permanent magnet 132. The recess 130 and permanent magnet 132 cooperate with each other to provide a disc holding means 134. On an outside of the third vessel section 124 are arranged six or first to sixth sputter units 22A to 22F, each of which includes a sputter chamber 138 communicating with an interior of the third vessel section 124, as shown in FIG. 6. The sputter chamber 138 is provided therein with a target 34 for emitting desired sputter particles therefrom. In the modification, the first to third sputter units 22A to 22C each are adapted to execute sputtering of SiN, therefore, the target 34 in the sputter chamber 138 of each of the sputter units 22A to 22C acts to emit SiN. The fourth sputter unit 22D is for the purpose of executing sputtering of TbFeCo, therefore, the target arranged in the unit 22D acts to emit TbFeCo. The fifth sputter unit 22E is adapted to execute sputtering of LaSiON, therefore, the target arranged in the unit 22E serves to emit LaSiON. The seventh sputter unit 22F is to execute sputtering of AlNi, therefore, the target arranged therein acts to emit LaSiON.

In the second modification constructed as descried above, the vacuum clean box 20 located at a position Q is for feeding of optical mini-discs 54 (base discs) on which a film is not formed yet. the vacuum clean box 20 at a position R is for removal of optical mini-discs 54 on which a film has been formed, and the vacuum clean box 20 at a position T is in reserve. The double gate valve mechanisms 36 at the positions Q, R and T to each of which the vacuum clean box 20 is airtightly connected is evacuated to a vacuum. The evacuation is preferably made to form a degree of vacuum as low as 0.1 Torr or less which is substantially the same as that in the stocker chamber described above. Then, the double gate valve mechanisms 36 each are actuated to open a shutter 28 on the side of the vacuum clean box 20 and a shutter 38 on the side of the first vessel section 94.

Then, rotating and lifting operation of the revolving and lifting drive section 98 of the vacuum robot 96 and expansion and contraction of the expansion arm 100 cause a distal end of the expansion arm 100 to hold each of the optical mini-discs 54 in the vacuum clean box 20 at the position Q, which is then moved to the posture converting unit 104. At this time, the electromagnet 120 of the pivotal arm 108 is kept excited, to thereby magnetically attract the inner peripheral mask 122 made of a magnetic material fitted on a central hole of the optical mini-disc 54. The holding members 106 in a pair are kept separated from each other when the optical mini-disc 54 is to be held therebetween but are closed to each other to hold a periphery of the disc 54 therebetween when it is positioned therebetween.

The posture converting unit 104 is rotated by an angle of 90 degrees from a position shown FIG. 7 to that of FIG. 8, to thereby permit the optical mini-disc 54 to take a vertical posture facing the disc holding section 134 at the distal end of the expansion arm 128, during which the electromagnet 120 of the pivotal arm 108 is kept excited. Then, the expansion arm 128 is advanced to receive the optical mini-disc 54 and concurrently the electromagnet 120 of the pivotal arm 108 is released from excitation. This causes the projection of the inner peripheral mask 122 of the optical mini-disc 54 to be engagedly fitted in the recess 130 of the disc holding section 134 of the expansion arm 128, resulting in the permanent magnet 132 magnetically attracting the projection of the inner peripheral mask 122, so that the optical mini-disc 54 may be released from the posture converting unit 104. This causes the disc 54 to be safely held on the disc holding section 134.

The seven expansion arms 128 repeat expansion and contraction in a synchronous manner and each are rotated by an angle of 360/7 degrees with intermittent rotation of the index table 126 when it is contracted. This results in the optical mini-disc 54 moved from the posture converting unit 104 to the disc holding section 134 being moved to a position opposite to the first sputter unit 22A with intermittent rotation of the index table 126. Then, expansion of the expansion arm 128 causes the optical mini-disc 54 to be introduced into the sputter chamber 138 of the sputter unit 22A, resulting in being positioned opposite to the target 34, so that sputtering of SiN is carried out on the optical mini-disc. Then, the expansion arm 128 is contracted and the index table 126 is rotated by an angle of 360/7 degrees, so that the optical mini-disc 54 may be moved to a position opposite to the second sputter unit 22B. Thus, the optical mini-disc is subjected to sputtering of SiN in the first sputter unit 22A, that of SiN in the second sputter unit 22B, that of SiN in the third sputter unit 22D, that of TbFeCo in the fourth sputter unit 22D, that of LaSiON in the fifth sputter unit 22E and that of AlNi in the sixth sputter unit 22F in order.

The optical mini-disc 54 which has been subjected to film formation in the sputter units 22A to 22F as described above is returned to the posture converting unit 104, in which the optical mini-disc is converted from a vertical posture into a horizontal posture. Then, it is transferred to the vacuum clean box 20 at the position R by means of the vacuum robot 96. The above-described procedure in the second modification is repeated on the remaining optical mini-discs 54.

Thus, it will be noted that the second modification described above accomplishes a multi-layer sputtering treatment with high efficiency and facilitates feeding and removal of the optical mini-discs with respect to the sputter units while keeping them clean or from being contaminated with dust and the like.

Figure 10:
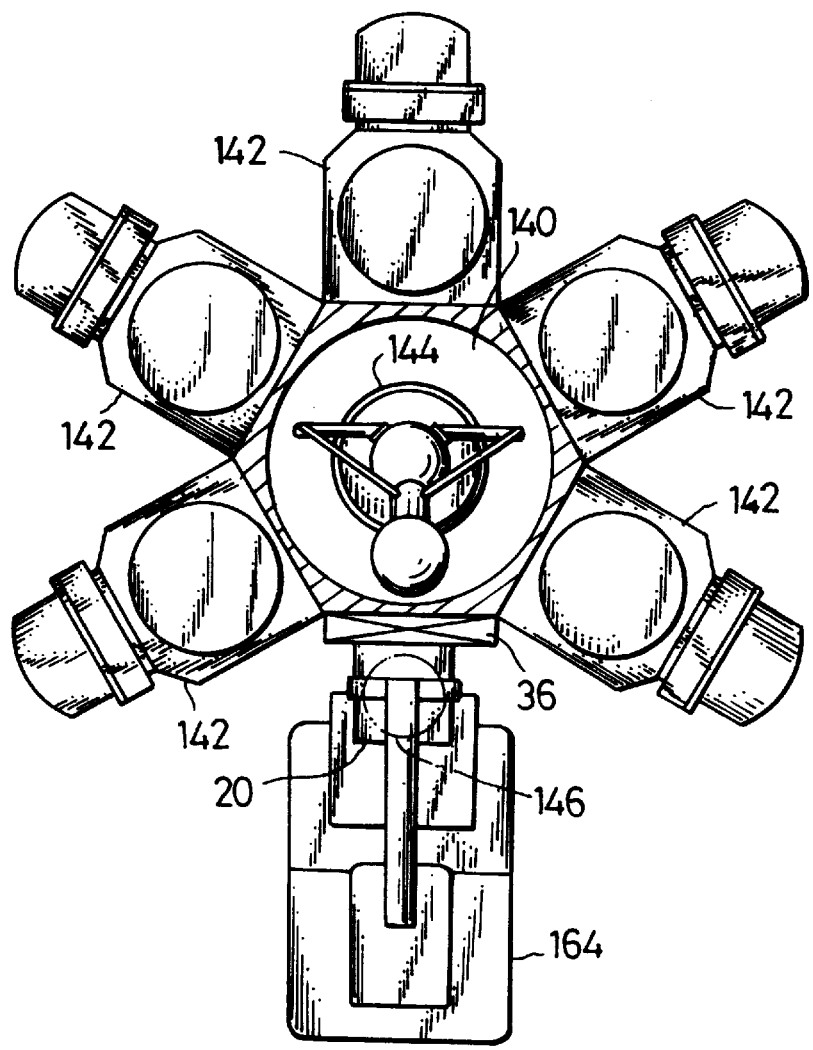
FIG. 10 is a plan view partly in section showing a PVD unit used in a further modification of the clean transfer apparatus shown in FIG. 1.
Figure 11:
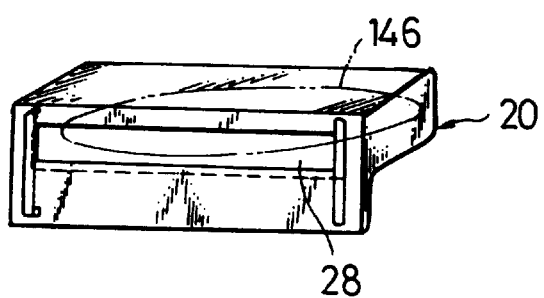
FIG. 11 is a perspective view showing a vacuum clean box used in the modification of FIG. 10.
Figure 12:
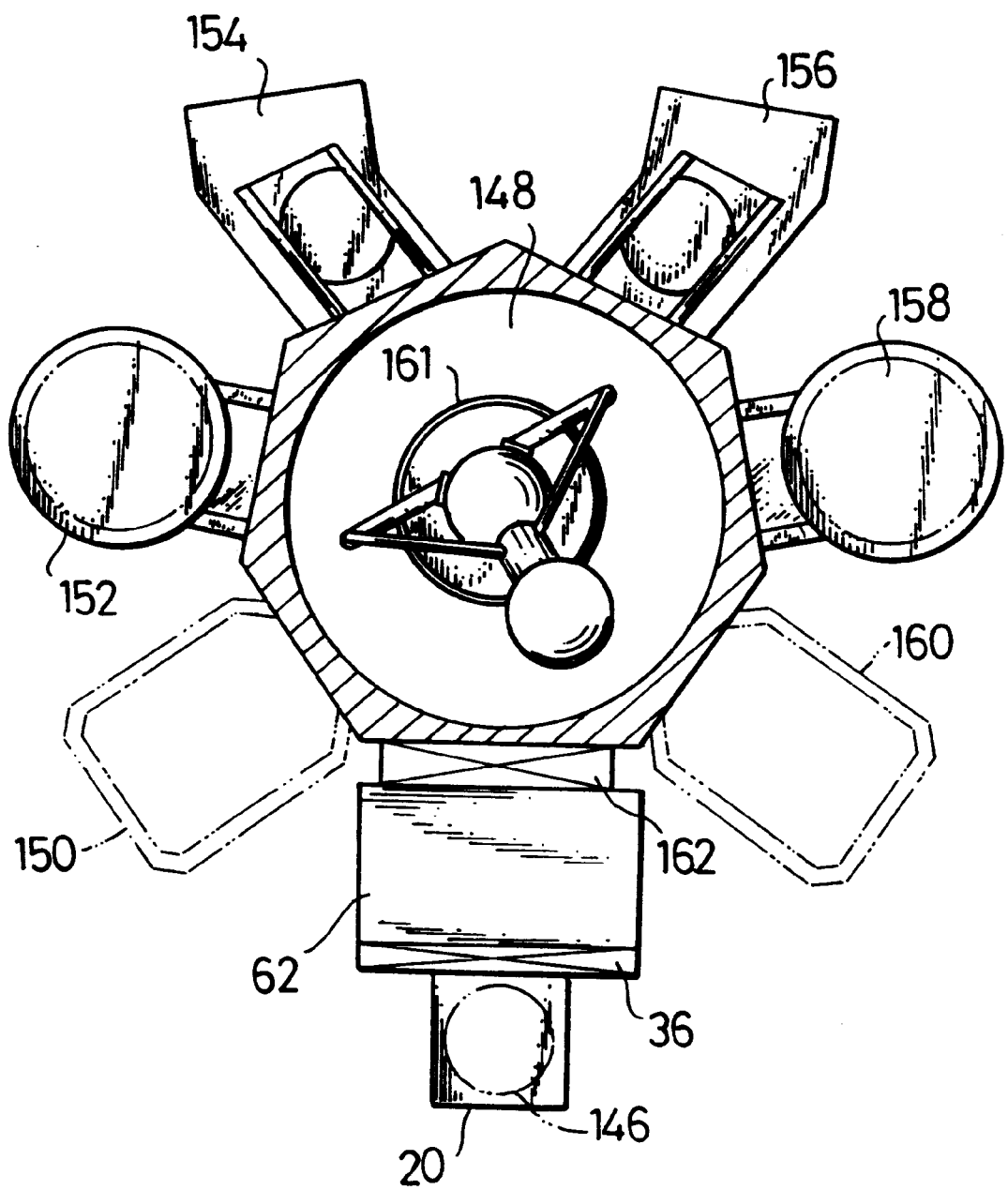
FIG. 12 is a plan view partly in section showing a processing unit of a nitrogen atmosphere used in the modification of FIG. 10.

Referring now to FIGS. 10 to 12, a further or third modification of the embodiment shown in FIG. 1 is illustrated. A clean transfer apparatus of the third modification is adapted to carry out a PVD treatment on a semiconductor wafer in a vacuum atmosphere and then subject it to a treatment such as etching or the like in a nitrogen atmosphere. FIG. 10 shows a PVD unit including a common vacuum chamber 140 and five PVD means 142 provided on the vacuum chamber 140. The common vacuum chamber 140 is provided therein with a vacuum robot 144. Also, the common vacuum chamber 140 is provided thereon with a double gate valve mechanism 36, to which a vacuum clean box 20 is connected. The vacuum clean box 20, as shown in FIG. 11, is adapted to receive a single semiconductor wafer 146 therein and includes a shutter 28 for selectively closing a transfer port of the vacuum clean box 20. FIG. 12 shows a treatment unit arranged with respect to a common chamber 148 of a nitrogen atmosphere, which unit includes a resist application means 150, a baking means 152, a developing means 154, a washing means 156, an etching means 158 and an exposure means 160. The common chamber 148 is provided therein with a robot 161. The common chamber 148 is connected thereto a vacuum changer 62 through an on-off valve 162, which vacuum changer 62 is mounted with a vacuum clean box 20 provided with a double gate valve mechanism 36.

In the third modification constructed as described above, the vacuum clean box 20 is connected to the double gate valve mechanism 36 of the PVD unit shown in FIG. 10 while being held on a carrier robot 164 and the double gate valve mechanism 36 is evacuated to a vacuum and opened. Then, the semiconductor wafer 146 in the vacuum clean box 20 is transferred to the respective PVD means 142 in turn by means of the vacuum robot 144, resulting in being subjected to a PVD treatment, followed by being returned to the vacuum clean box 20. After the PVD treatment, the vacuum clean box 20 in which the semiconductor wafer 146 is stored is moved by the carrier robot 164 and connected to the double gate valve mechanism 36 of the treatment unit shown in FIG. 12 and then converted from a vacuum into a nitrogen atmosphere by means of the vacuum changer 62. Subsequently, the on-off valve 162 is opened so that the semiconductor wafer 146 is transferred to the resist application means 150, baking means 152, developing means 154, washing means 156, etching means 158 and exposure means 160 in order by means of the robot 161, resulting in being subjected to predetermined treatments. The semiconductor wafer 146 thus treated is returned through the vacuum changer 62 to the vacuum clean box 20.

Thus, it will be noted that the third modification effectively executes desired treatments of the semiconductor wafer 146 in both vacuum and nitrogen atmospheres with high efficiency and facilitates feeding and removal of the semiconductor wafer with respect to the treating means by means of the vacuum clean box 20.

The above description has been made on the processing units such as a sputter unit, a PVD unit and the like. However, it is a matter of course that the present invention can be applied to a unit such as a deposition unit, an ion plating unit or the like.

As can be seen from the foregoing, the embodiment described above eliminates arrangement of any vacuum evacuation means and transfer means in the vacuum clean box, so that the apparatus may be simplified in structure. More particularly, positioning of the vacuum clean box with respect to each of the vacuum units or processing units kept at a vacuum is highly facilitated. Also, connection of the vacuum clean box to the processing unit may be readily carried out manually or by means of a commercially available robot which is not required to be kept clean. Further, even when an unmanned carrier is used for moving the vacuum clean box, it may be moved to any desired place after connection of the vacuum clean box to the processing unit, so that the unmanned carrier may be significantly increased in operating efficiency. In addition, a size of a space in the vacuum clean box is minimized because it is free of any vacuum evacuation means and transfer means, to thereby be adequately kept airtight to a degree of substantially increasing a period of time during which a vacuum is kept therein. In addition, the transferred object can be stored for an increased period of time while being received in the vacuum clean box, resulting in handling of the transferred object being facilitated.

Figure 13:
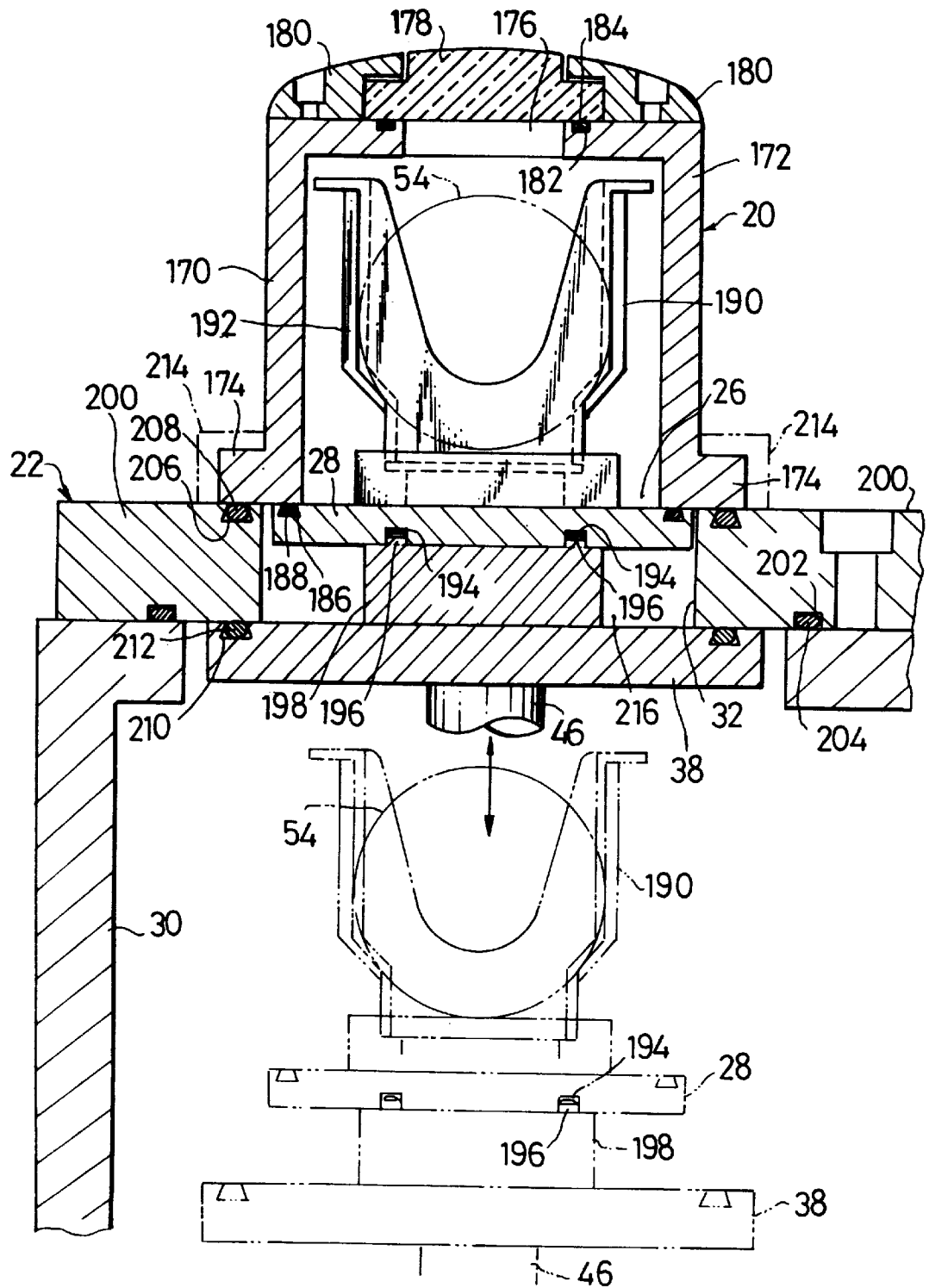
FIG. 13 is a front elevation view insertion showing another embodiment of a clean transfer apparatus according to the present invention.

Referring now to FIG. 13, another or a second embodiment of a clean transfer apparatus according to the present invention is illustrated. In a clean transfer apparatus of the illustrated embodiment, a vacuum clean box 20 includes a box body 170 provided at one or a lower end thereof with a first opening 26 and a first shutter 28 acting also as a lid and arranged for selectively airtightly closing the opening 26. The vacuum clean box 20 is constructed so as to be kept at a vacuum due to closing of the box body 170 with the first shutter 28, to thereby eliminate arrangement of any vacuum evacuation means and transfer means therefor in the vacuum cleans box 20. The box body 170 includes a box-like member 172 formed at one or a lower end thereof with the above-described first opening 26 and a flange 174 surrounding the opening 26 and at the other or an upper end thereof with an aperture 176, a transparent member 178 for airtightly closing the aperture 176, and a fixing means 180 for fixedly mounting the transparent member 178 on the box-lime member 172. The transparent member 178 serves as a viewing window through which an interior of the vacuum clean box 20 may be observed from the outside. The box-like member 172 is provided at a portion thereof abutted against the transparent member 178 with a groove 182, in which an O-ring 184 is arranged for airtight sealing. The fixing means 180 is fixed to the box-like member 172 by means of screws or the like.

The shutter 28 acting also as the lid is formed at a portion thereof abutted against the box body 170 of the vacuum clean box 20 with a groove 186, in which an O-ring 188 for airtight sealing is arranged. The shutter 28 is mounted on a front or upper surface thereof with a holder 190 for supporting optical mini-discs or transferred objects 54 thereon. The holder 190 is constructed so as to receive a plurality of optical mini-discs 54 in a manner to be laterally spaced from each other at predetermined intervals while being kept vertical. More particularly, the holder 190 includes a plurality of partitions 192 fixed on the shutter 28 so as to define a plurality of compartments, in which the optical mini-discs 54 are received, respectively. The shutter 28 is formed on a rear or lower surface thereof with a plurality of aligning recesses 194, in which positioning pins 196 provided on the side of a vacuum unit 22 which will be described hereinafter are detachably fitted, respectively.

The vacuum unit 22 such as a film forming unit or the like which is connected to the vacuum clean box 20 includes an airtight vessel 30 provided with a second opening 32, a second shutter 38 mounted on a distal end of an actuation rod 46 of a shutter actuation means such as a fluid pressure cylinder or the like, a spacer block 198 fixed on an upper surface of the shutter 38, and a plurality of positioning pins 196 briefly described above which are fixed on the spacer block 198 so as to upwardly extend from an upper surface thereof. The shutter actuation rod 46 is constructed so as to be expandably driven to vertically move the shutter 38. The positioning pins 196, as described above, are detachably fitted in the positioning or aligning recesses 194 of the shutter 28. The opening 32 is defined by a connection block 200 fixed on the airtight vessel 30, which connection block 200 is formed into a thickness equal to the sum of a thickness of the second shutter 28 and that of the spacer block 198. The connection block 200 is formed on a surface portion thereof abutted against the airtight vessel 30 with a groove 202, in which an O-ring 204 for airtight sealing is arranged. Likewise, the connection block 200 is formed on a surface portion thereof abutted against the flange 174 of the vacuum clean box 20 with a groove 206, in which an O-ring 208 for airtight sealing is arranged. Further, the shutter 38 is formed on a surface portion thereof abutted against the connection block 200 with a groove 210, in which an O-ring 212 for airtight sealing is arranged.

The vacuum unit 22 may include a vacuum evacuation means such as a vacuum pump or the like, as well as a suitable transfer means for transferring the optical mini-discs received in the airtight vessel 30 to a predetermined film formation position.

Now, the manner of operation of the clean transfer apparatus of the second embodiment constructed as described above will be described hereinafter.

Prior to connection to the vacuum unit or film forming unit 22, the vacuum clean box 20 is previously evacuated to a vacuum by means of a vacuum changer (not shown) separately arranged. The evacuation is preferably made to a degree of vacuum as low as 0.1 Torr or less to substantially reduce dust. Then, the vacuum clean box 20 is closed with the shutter 28. When the vacuum clean box 20 is kept separated from the vacuum unit 22, a pressure difference between a vacuum in the vacuum clean box 20 and an atmospheric pressure surrounding the vacuum clean box 20 causes the shutter also acting as the lid to be forcedly pressed against the first opening 26 of the vacuum clean box 20, to thereby positively airtightly seal the opening 26 and prevent the first shutter 28 from moving with respect to the vacuum clean box 20, resulting in the vacuum clean box 20 being safely transferred while receiving the optical mini-discs 54 therein. Also, the second shutter 38 on the side of the vacuum unit 22 is forced against an inner surface of the connection block 200 constituting an edge of the opening 32 by means of the shutter actuation rod 46, to thereby airtightly seal the second opening 32.

Connection between the vacuum clean box 20 and the vacuum unit 22, as shown in FIG. 13, is carried out by abutting the first shutter 28 of the vacuum clean box 20 against the connection block 200 to put the former on the latter while keeping the first shutter 28 of the vacuum clean box 20 down and then fitting the positioning pins 196 of the vacuum unit 22 in the aligning recesses 194 of the vacuum clean box 20. At this time, the flange 174 is kept secured to the connection block 200 by means of a fixture 214.

The connection between the vacuum clean box 20 and the vacuum unit 22 carried out as described above results in a closed space 216 being airtightly defined by cooperation of an inner side surface of the connection block 200 defining the second opening 32, a lower surface of each of the first shutter 28 and flange 174, and an upper surface of the second shutter 38. More particularly, the first and second shutters 28 and 38 are arranged so as to be spacedly opposite to each other with the closed space 216 being interposed therebetween. The closed space 216 exposed to an atmospheric pressure when it is initially formed is then evacuated to a vacuum through an evacuation passage (not shown) by means of the vacuum evacuation means provided on the side of the vacuum unit 22. The space 216 is preferably evacuated to a degree of vacuum as low as, for example, 0.1 Torr or less.

Evacuation of the closed space 216 causes the above-described pressure difference between the interior of the vacuum clean box and the exterior thereof to be eliminated. Therefore, when the shutter actuation rod 46 is contracted to downwardly move the second shutter 38 and spacer block 198, to thereby permit the vacuum clean box 20 and vacuum unit 22 to communicate with each other, weight of the first shutter 28, holder 190 and optical mini-discs 54 causes the shutter 28 and optical mini-discs 54 to be likewise downwardly moved with lowering of the shutter 38 and spacer block 198, so that the shutter 28 and optical mini-discs 54 are introduced into the airtight vessel 30. In this instance, the positioning pins 196 of the spacer block 198 and the aligning recesses 194 of the shutter 28 are kept engaged with each other, so that shutter 28 may be stopped while being aligned with the spacer block 198. This results in transfer of the optical mini-discs 54 in the vacuum unit 22 in a subsequent step being smoothly executed.

The above-described vacuum evacuation of the closed space 216 causes an atmospheric pressure acting on the clean transfer apparatus to forcedly press the flange 174 of the vacuum clean box 20 against the connection block 200, to thereby effectively prevent leakage into the closed space 216.

Whereas, when the vacuum clean box 20 connected to the vacuum unit 22 is to be disconnected from the vacuum unit 22, the shutter actuation rod 46 is expanded to return the first shutter 28 from a position indicated at phantom lines to that indicated at solid lines. This causes the closed space 216 to be formed again due to cooperation of the connection block 200, the first shutter 28 and flange 174, and the second shutter 38. Then, the closed space 216 is return to an atmospheric pressure, to thereby cause it to be applied to the lower surface of the shutter 28. This causes the atmospheric pressure in the closed space 216 to upwardly force the lower surface of the shutter 28, resulting in the box body 170 and shutter 28 being rendered airtightly integral with each other, so that the shutter 28 may be readily released from the positioning pins 196. Then, the fixture 214 is detached from the flange 174, to thereby permit the vacuum clean box 20 to be transferred to any desired position while keeping the box body 170 integral with the shutter 28 and receiving the optical mini-discs 54 therein.

Also, the clean transfer apparatus of the illustrated embodiment may be arranged common to a plurality of film forming steps or the like, wherein the vacuum clean box 20 is connected to film forming units in turn, to thereby laminatedly deposit plural kinds of films on a transferred object such as a substrate. In this instance, an order in which the vacuum clean box is connected to the film forming units may be varied as desired and a part of the units may be skipped. Also, an order in which the films are deposited on the transferred object and the number of films to be deposited on the object may be set as desired. Thus, the clean transfer apparatus of the second embodiment may effectively exhibit flexibility to a change in specifications. This is highly advantageous as compared with an in-line sputter apparatus in which a plurality of sputter units are connected in series to each other to successively transfer substrates therethrough, because the in-line sputter apparatus causes an order of film formation to be previously determined.

Thus, the second embodiment described above is constructed so as to concurrently carry out transfer of the optical mini-discs or transferred objects 54 and movement of the first and second shutters 28 and 38. Such construction eliminates a necessity of providing a mechanism for transferring the transferred object independent from a mechanism for actuating the shutters in the closed space 216, to thereby minimize a size of the closed space. This permits vacuum evacuation of the closed space 216 at the time of connection of the vacuum clean box 20 to the vacuum unit 22 to be carried out in a reduced period of time.

As can be seen from the foregoing, the clean transfer apparatus of the second embodiment eliminates arrangement of any vacuum evacuation means and transfer means in the vacuum clean box, to thereby be simplified in structure and facilitate positioning of the vacuum clean box with respect to the various processing units. Connection of the vacuum clean box to the processing unit may be carried out manually or by means of a commercially available robot which is not required to be kept clean. Further, the shutter of the vacuum clean box is drawn into the vacuum unit by means of the shutter actuation means while being kept engaged with the second shutter on the side of the vacuum unit. Such construction permits the transferred objects to be readily transferred between the vacuum clean box and the vacuum unit. Moreover, the transferred objects and first shutter may be concurrently introduced into the vacuum unit, so that a size of the closed space required to be evacuated between the vacuum clean box and the vacuum unit may be minimized, resulting in substantially reducing time required for connection and disconnection of the vacuum clean box with respect to the vacuum unit. In addition, a space in the vacuum clean box is minimized because it is free of any vacuum evacuation means and transfer means, to thereby be adequately kept airtight to a degree of substantially increasing a period of time during which a vacuum is kept in the vacuum clean box. In addition, storage of the transferred object can be continued for an increased period of time while being received in the vacuum clean box, resulting in handling of the transferred object being highly facilitated.

Figure 14:
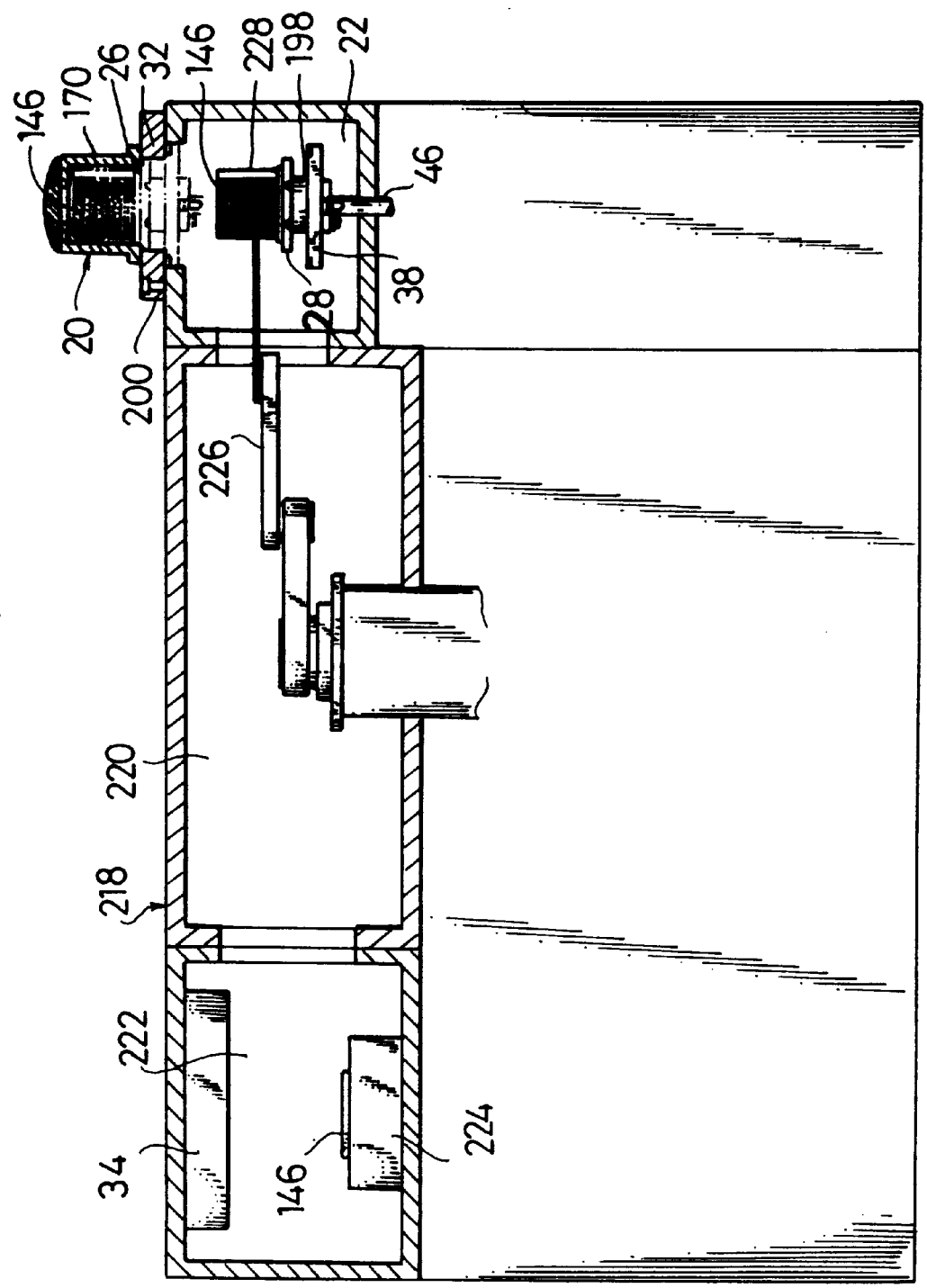
FIG. 14 is a front elevation view in section showing a modification of the embodiment of FIG. 13.
Figure 15:
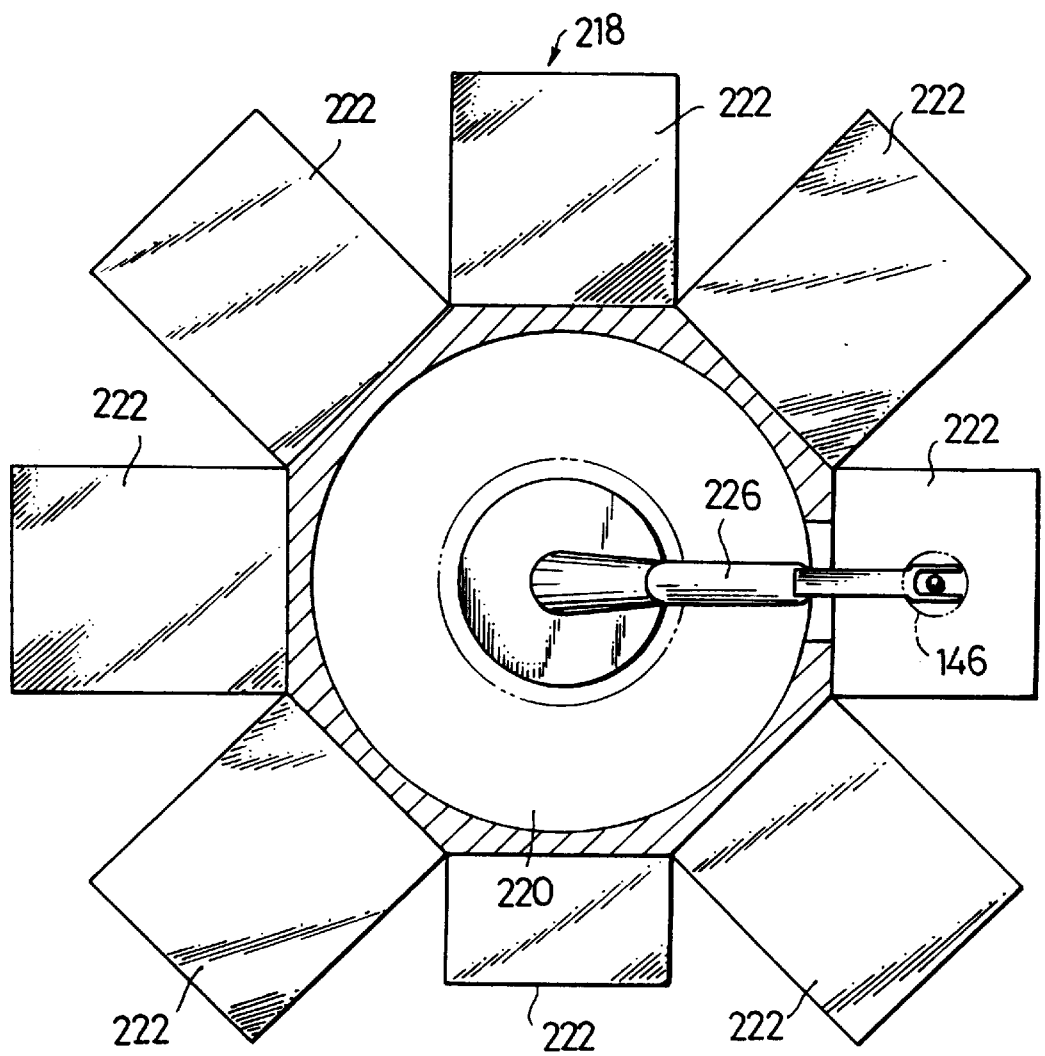
FIG. 15 is a schematic plan view of the modification shown in FIG. 14.

Referring now to FIGS. 14 and 15, a modification of the embodiment shown in FIG. 13 is illustrated. A clean transfer apparatus of the modification is generally constructed in such a manner that semiconductor wafers 146 received in a vacuum clean box 20 are transferred to a multi-chamber type processing unit 218 while being kept horizontal. The multi-chamber type processing unit 218, as shown in FIGS. 14 and 15, includes a vacuum transfer zone 220, a plurality of processing zones 222 arranged so as to communicate with the vacuum transfer zone 220, and a vacuum changer 22 acting as a vacuum unit to which the vacuum clean box 20 is connected. The processing zone 222, when it is, for example, a sputter unit, is so constructed that a target 34 for emitting desired sputter particles is arranged in a manner to be opposite to a support 224 on which the semiconductor wafer 146 is arranged. The vacuum transfer zone 220 is provided therein with a robot arm 226 for transferring the semiconductor wafers 146 in turn.

The vacuum cleans box 20 and vacuum changer 22 may be constructed in substantially the same manner as those in the second embodiment described above with reference to FIG. 13. The vacuum changer 22 in the modification corresponds to the film forming unit 22 in the second embodiment. However, in the modification, a first shutter 28 acting also as a lid is mounted on an upper surface thereof with a holder 228 for horizontally supporting a plurality of semiconductor wafers 146 thereon while keeping them laminated on each other. The remaining part of the modification may be constructed in substantially the same manner as the second embodiment.

In the modification of FIGS. 14 and 15, the vacuum clean box 20 is connected to the vacuum changer 22, to thereby communicate with the vacuum changer according to substantially the same procedure as in the second embodiment. Then, the shutter actuation rod 46 is contracted to downwardly move the shutter 28 and semiconductor wafers 146 together with a second shutter 38 and a spacer block 198 to introduce the semiconductor wafers 146 into the vacuum changer 22. This causes the semiconductor wafers to be placed on the holder 228 on the shutter 28 located at a retracted position. Then, the semiconductor wafers 146 are transferred to the processing zones 222 in turn by means of the robot arm 226. Thus, the semiconductor wafers which have been subjected to processing in each of the processing zones are returned to the holder 228 arranged on the shutter 28. Subsequently, the shutter actuation rod 46 is expanded to forcedly press the shutter 28 against a box body 170 of the vacuum clean box and then the vacuum clean box 20 is separated from the vacuum changer 22 while being kept integral with the shutter 28.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A transfer method comprising:

providing a vacuum box having a first shutter for selectively opening and closing a first opening to the interior of said vacuum box, said vacuum box being free of any vacuum evacuation means and transfer means;

providing a vacuum unit having a second shutter for selectively opening and closing a second opening to the interior of said vacuum unit, and further including a gate having an interior which communicates with said interior of said vacuum unit through said second opening when said second shutter opens said second opening, and a shutter engagement means for causing said second shutter to open and close said second opening;

moving said vacuum box from a first location separate from said vacuum unit to a second location adjacent said vacuum unit and forming an airtight closed space between said first opening and said second opening, said first shutter closing said first opening to maintain a vacuum in said interior of said vacuum box during said moving step due to surrounding said vacuum box with substantially atmospheric pressure such that said vacuum causes said first shutter to close said first opening, said second shutter closing said second opening during said moving step;

connecting said vacuum box to said vacuum unit;

removably engaging said first shutter with said shutter engagement means during said connecting step, said step of removably engaging said first shutter with said shutter engagement means being carried out in such a manner that said first shutter is capable of being disengaged from said shutter engagement means when said first shutter is closing said first opening of said vacuum box;

evacuating said interior of said gate to vacuum after said moving step; and removing said first and second shutters from said first opening and said second opening, respectively, to permit said interiors of said vacuum box and vacuum unit to communicate.

2. The method of claim 1 wherein said removing step further comprises said shutter engagement means removing said first shutter from said first opening and storing said first shutter in said interior of said gate.

3. A transfer method comprising the steps of:

providing a vacuum box having an interior, a first opening extending from said interior to the exterior of said vacuum box and providing an exterior periphery on said vacuum box about said first opening, and a first shutter arranged exteriorly of said vacuum box so as to selectively close said first opening by abutting said exterior periphery of said first opening, said vacuum box being constructed so as to provide airtightness sufficient to keep said interior thereof at a vacuum when said first opening is closed with said first shutter, and said vacuum box being free of any vacuum evacuation means and transfer means;

providing a vacuum unit having a second opening and a second shutter arranged so as to selectively close said second opening, said vacuum unit being provided with a shutter actuating mechanism for selectively actuating said second shutter to disengage from closing said second opening;

moving said vacuum box from a location separate from said vacuum unit to a location adjacent said vacuum unit;

airtightly connecting said vacuum box and said vacuum unit to each other, said connecting step being carried out while keeping said first and second openings closed with said first and second shutters, respectively, to thereby form a closed space therebetween through which said first and second shutters are opposite to each other;

removably connecting said first shutter to said shutter actuating mechanism during said airtightly connecting step so that said first shutter is selectively actuable to disengage from closing said first opening, said step of removably connecting said first shutter to said shutter actuating mechanism being carried out in such a manner that said first shutter is capable of being disconnected from said shutter actuating mechanism when said first shutter is closing said first opening of said vacuum box;

evacuating said closed space to a vacuum; and actuating said shutter actuating mechanism to disengage said first and second shutters from said vacuum box and said vacuum unit, respectively, to permit said vacuum box and said vacuum unit to communicate with each other.

4. The transfer method as defined in claim 3, wherein said shutter actuating mechanism comprises a double gate valve mechanism and wherein said connection between said vacuum box and said vacuum unit is carried out through said double gate valve mechanism.

5. The transfer method as defined in claim 4, wherein said first and second shutters are actuated through said double gate valve mechanism.

6. The transfer method as defined in claim 3, further comprising the step of introducing said first and second shutters into said vacuum unit while said first shutter is connected to said second shutter.

7. A transfer method comprising the steps of:

providing a vacuum box having a box body having an interior and a first opening extending from said interior to the exterior of said box body to provide an exterior periphery on said box body about said first opening, said vacuum box further including a first shutter arranged exteriorly of said box body so as to selectively airtightly close said first opening by abutting said exterior periphery of said first opening and to also serve as a lid, said vacuum box being constructed so as to provide airtightness sufficient to keep said interior of said box body at a vacuum when said first opening is closed with said first shutter, and said vacuum box being free of any vacuum evacuation means and transfer means;

providing a vacuum unit having a second opening and including a second shutter detachably engaged with said first shutter of said vacuum box and arranged so as to selectively close said second opening of said vacuum unit;

providing a shutter actuating mechanism for selectively actuating said first and second shutters to disengage from closing said first and second openings, respectively, when said first and second shutters are connected to said shutter actuating mechanism;

moving said vacuum box from a location separate from said vacuum unit to a location adjacent said vacuum unit;

airtightly connecting said vacuum box and said vacuum unit to each other, said connecting step being carried out while keeping said first and second shutters engaged with each other when said first and second openings are kept closed with said first and second shutters, to thereby form a closed space therebetween through which said first and second shutters are opposite to each other;

removably connecting said first shutter to said shutter actuating mechanism during said airtightly connecting step so that said first and second shutters are selectively actuable to disengage from closing said first and second openings, respectively, said step of removably connecting said first shutter to said shutter actuating mechanism being carried out in such a manner that said first shutter is capable of being disconnected from said shutter actuating mechanism when said first shutter is closing said first opening of said vacuum box;

evacuating said closed space to a vacuum; and introducing said first and second shutters into said vacuum unit while said first shutter is connected to said second shutter by actuating said shutter actuation mechanism to actuate both said first and second shutters to disengage from closing said first and second openings of said vacuum box and vacuum unit, respectively.

8. The transfer method as defined in claim 7, wherein said second shutter is arranged so as to abut against an interior periphery of said vacuum unit around said second opening in a manner to selectively airtightly close said second opening.

9. A transfer apparatus comprising:

a vacuum box having an interior, a first opening extending from said interior to an exterior of said vacuum box to provide an exterior periphery on said vacuum box about said first opening, and a first shutter arranged exteriorly of said vacuum box so as to selectively close said first opening by abutting said exterior periphery of said first opening, said vacuum box being constructed so a s to provide airtightness sufficient to keep said interior thereof at a vacuum when said first opening is closed with said first shutter, an d said vacuum box being free of any vacuum evacuation means and transfer means; and a vacuum unit having a second opening and a second shutter arranged so as to selectively close said second opening, and shutter actuation means for actuating both of said first and second shutters of said vacuum box and vacuum unit, said shutter actuation means being arranged on the side of said vacuum unit;

said vacuum box being capable of movement from a location separate from said shutter actuation means to a location adjacent said shutter actuation means for connection to said vacuum unit, and said first shutter being arranged on said vacuum box so as to be removably connected to said shutter actuation means when said vacuum box and vacuum unit are connected to each other and so as to be capable of being disconnected from said shutter actuation means when said first shutter is closing said first opening of said vacuum box; and said vacuum box and vacuum unit cooperating with each other to form a closed space therebetween through which said first and second shutters are opposite to each other when said vacuum box and vacuum unit are connected to each other, so that said vacuum box and vacuum unit are permitted to communicate with each other through said closed space when said first and second shutters are disengaged from said vacuum box and vacuum unit, respectively.

10. The transfer apparatus as defined in claim 9, wherein said vacuum unit is provided therein with a source for producing particles for film formation; and said vacuum box is provided therein with a transferred object to be subjected to film formation.

11. The transfer apparatus as defined in claim 10, wherein said vacuum unit is further provided therein with a vacuum evacuation means and a transfer means for transferring the transferred object.

12. The transfer apparatus as defined in claim 9, wherein said vacuum unit is further provided therein with a vacuum evacuation means and a transfer means for transferring the transferred object.

13. The transfer apparatus as defined in claim 9, wherein the connection between said vacuum box and said vacuum unit is carried out through said shutter actuation means.

14. The transfer apparatus as defined in claim 9, wherein said first and second shutters are provided with engagement means for detachably engaging said first shutter with said second shutter.

15. The transfer apparatus as defined in claim 14, wherein said engagement means include a recess formed in one of said first and second shutters and a projection mounted on the other of said first and second shutters so as to be fitted in said recess.

16. The transfer apparatus as defined in claim 9, wherein said first shutter is provided thereon with a holder for holding a transferred object at a predetermined posture.

17. A transfer apparatus comprising:

a vacuum box including a box body having an interior and a first opening extending from said interior to an exterior of said box body to provide an exterior periphery on said box body about said first opening, said vacuum box further including a first shutter arranged exteriorly of said box body so as to selectively close said first opening by abutting said exterior periphery of said first opening, said vacuum box being constructed so as to provide airtightness sufficient to keep said interior thereof at a vacuum when said first opening is closed with said first shutter, and said vacuum box being free of any vacuum evacuation means and transfer means; and a vacuum unit provided with a second opening and including a second shutter detachably engaged with said first shutter of said vacuum box and arranged so as to selectively close said second opening of said vacuum unit and a shutter actuation means for actuating said second shutter;

said vacuum box and vacuum unit being capable of being moved with respect to each other and being connected and disconnected from one another, and when connected to each other, cooperating with each other to form a closed space therebetween through which said first and second shutters are opposite to each other, and said first shutter being arranged to be removably connected to said shutter actuation means through said second shutter so as to be movable by said shutter actuation means when said vacuum box and vacuum unit are connected to each other, and also arranged so as to be capable of being disconnected from said shutter actuation means when said first shutter is closing said first opening of said vacuum box; and said vacuum box and vacuum unit communicating with each other when said first and second shutters are introduced into said vacuum unit by said shutter actuation means while being kept engaged with each other.

18. The transfer apparatus as defined in claim 17, wherein said second shutter is mounted thereon with a positioning pin means detachably engaged with said first shutter.

19. The transfer apparatus as defined in claim 17, wherein said first shutter is provided thereon with a holder for holding a transferred object at a predetermined posture.

20. A transfer method comprising the steps of:

providing a vacuum box having a first shutter arranged exteriorly of said vacuum box for selectively opening and closing a first opening to the interior of said vacuum box by abutting a periphery of said first opening on the exterior of said vacuum box, said vacuum box being constructed so as to provide airtightness sufficient to keep said interior thereof at a vacuum when said first opening is closed with said first shutter and said vacuum box being free of any vacuum evacuation means and transfer means;

providing a vacuum unit having a second shutter for selectively closing a second opening to the interior of said vacuum unit;

providing a shutter actuation mechanism for actuating said first and second shutters of said vacuum box and vacuum unit, respectively;

moving said vacuum box by a carrier means holding said vacuum box from a location separate from said vacuum unit to a location adjacent said vacuum unit;

airtightly connecting said vacuum box and said vacuum unit to each other, said connecting step being carried out while keeping said first and second openings closed with said first and second shutters, respectively, to thereby form a closed space therebetween through which said first and second shutters are opposite to each other;

removably connecting said first shutter to said shutter actuation mechanism during said step of airtightly connecting said vacuum box and said vacuum unit, said step of removably connecting said first shutter to said shutter actuating mechanism being carried out in such a manner that said first shutter is capable of being disconnected from said shutter actuating mechanism when said first shutter is closing said first opening of said vacuum box;

evacuating said closed space to a vacuum;

actuating said shutter actuation mechanism to disengage said first and second shutters from said vacuum box and said vacuum unit, respectively, to permit said vacuum box and vacuum unit to communicate with each other; and moving said carrier means away from said vacuum box.

* * * * *

UNITED STATES PATENT AND TRADEMARK OFFICE
CERTIFICATE OF CORRECTION

PATENT NO. : 6,136,168
DATED : October 24, 2000
INVENTOR(S) : Masujima et al.

It is certified that error appears in the above-identified patent and that said Letters Patent is hereby corrected as shown below:

Column 1, Line 9, "i n" should read --in--.
Column 8, Line 27, "8U" should read --80--.
Column 19, Line 19, "a s" should read --as--.
Column 19, Line 21, "an d" should read --and--.

Signed and Sealed this

Twenty-second Day of May, 2001

Attest:

NICHOLAS P. GODICI

Attesting Officer        Acting Director of the United States Patent and Trademark Office